United States Patent [19]

Avanic et al.

[11] Patent Number: 5,045,815
[45] Date of Patent: Sep. 3, 1991

[54] AMPLITUDE AND PHASE BALANCED VOLTAGE-CONTROLLED OSCILLATOR

[75] Inventors: Branko Avanic, Coral Gables; Leng H. Ooi; Peter J. Yeh, both of Sunrise, all of Fla.

[73] Assignee: Motorola, Inc., Schaumburg, Ill.

[21] Appl. No.: 620,957

[22] Filed: Dec. 3, 1990

[51] Int. Cl.$^5$ ............................................... H03B 1/00
[52] U.S. Cl. ............................................ 331/96; 331/74
[58] Field of Search ................... 331/74, 96, 107 SL, 331/107 P, 108 R, 109

[56] References Cited

PUBLICATIONS

Petrovic et al., "A Balanced RF Oscillator", *RF Design*, Dec. 89, at pp. 35-38.

*Primary Examiner*—Robert J. Pascal
*Attorney, Agent, or Firm*—Michael J. Buchenhorner

[57] ABSTRACT

An oscillator comprises a resonator for providing an oscillation frequency for the oscillator, an active network, coupled to the resonator, for driving the resonator, and a split-ring resonator coupled to the main resonator and used to provide amplitude and phase balanced outputs. The split-ring resonator has at least a first edge, which is coupled to the resonator, and a second edge. The second edge has a gap therein, and a first terminal located at one side of the gap, and a second terminal symmetrically located at the other side of the gap.

15 Claims, 3 Drawing Sheets

AMPLITUDE AND PHASE BALANCED VOLTAGE-CONTROLLED OSCILLATOR

TECHNICAL FIELD

This invention relates generally to voltage-controlled oscillators (VCOs) and more specifically to VCOs using split ring resonators.

BACKGROUND

Referring to FIG. 1(a), a block diagram shows a typical configuration of an oscillator 10. The oscillator comprises a resonator 12, an active network 14, coupled to the resonator, a matching network 16, coupled to the active network, and an external load 18 coupled to the matching network 16. The resonator 12 determines the frequency of the oscillator and the matching network 16 couples energy to the load 18. In FIG. 1(b) there is shown another known type of oscillator 20 wherein the energy is coupled out of the resonator 24 from the active network 22 to the load 28, through a matching network 26. Such known balanced oscillators typically use two active devices (e.g., transistors). However, achieving both amplitude and phase balance is generally difficult, and tweaking for balance is usually required. The amplitude and the phase balance are dependent on all the components including the transistors, and matched pairs of components are required (e.g., transistors, varactors, and capacitors). Thus a need exists for balanced oscillators in which both amplitude and phase balance are more easily accomplished.

SUMMARY OF THE INVENTION

Accordingly, it is an object of the present invention to overcome the detriments of the prior art.

Briefly, according to the invention, an oscillator comprises a resonator for determining the oscillation frequency for the oscillator, an active network, coupled to the resonator, for driving the resonator, and a split-ring resonator used to provide amplitude and phase balanced outputs. The split-ring resonator has at least a first edge, which is coupled to the resonator, and a second edge. The second edge has a gap therein, and a first terminal located at one side of the gap, and a second terminal symmetrically located at the other side of the gap.

DETAILED DESCRIPTION OF THE PREFERRED EMBODIMENT

Figure 1A:
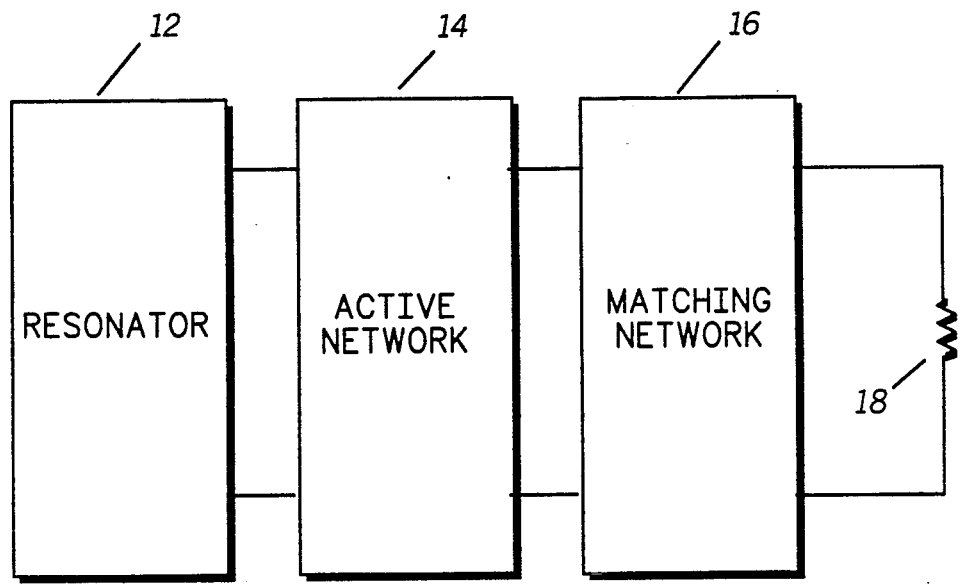
FIG. 1(a) and FIG. 1(b) are block diagrams representing conventional oscillators.
Figure 1B:
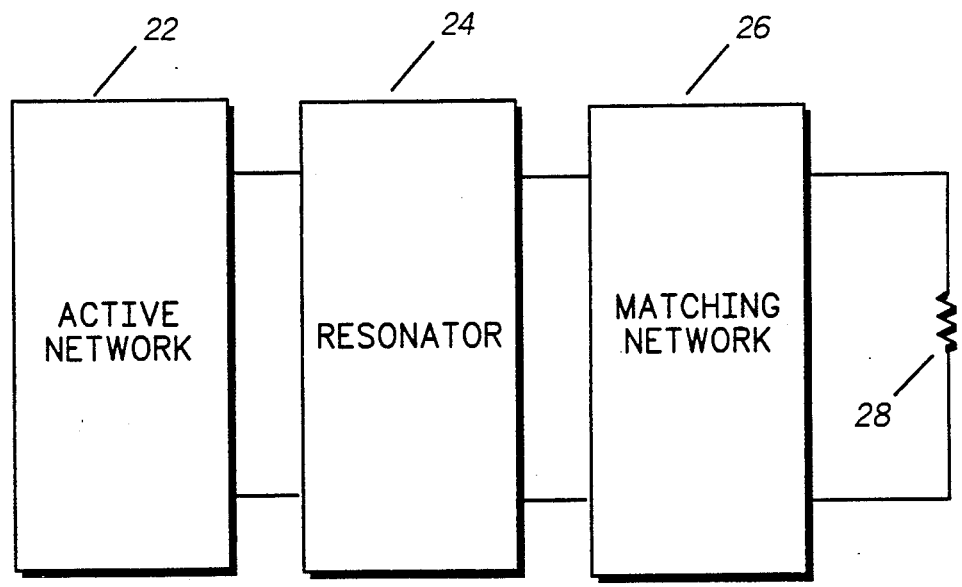
Figure 2:
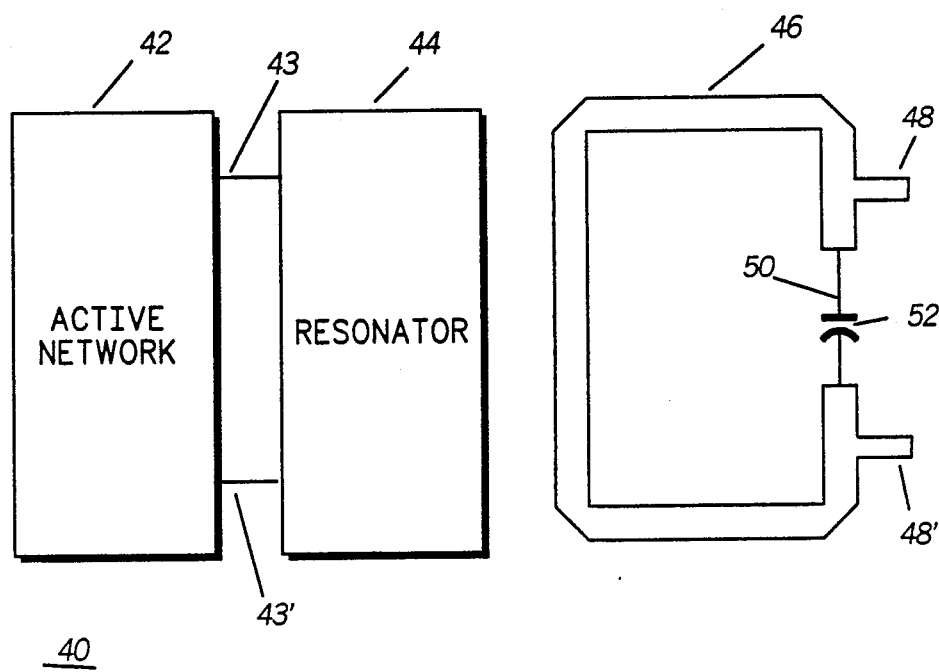
FIG. 2 shows an amplitude and phase balanced oscillator in accordance with the invention.

Referring to FIG. 2 an oscillator 40 in accordance with the invention is shown. The oscillator 40 comprises a split-ring resonator 46 coupled to a conventional resonator 44, and a conventional active network 42. The split-ring resonator 46 includes a first edge that is coupled to the resonator 44, and a second having a gap therein and a pair of balanced output terminals 48 and 48' for providing signals to a load connected across those terminals. Terminals 48 and 48' are located at points on the second edge of the split-ring resonator 46 that are symmetrically located on each side of the gap. Signals are applied to the load by electromagnetically coupling the split-ring resonator 46, which is resonant at the frequency of operation, to the main resonator 44 of the oscillator 40. A capacitor 52 is connected across the gap 50 to shorten the length of the split-ring resonator 46 required to achieve resonance at the desired frequency. Coupling energy out of a second resonator, specifically, a split-ring resonator, exploits the electrical properties of that structure to make amplitude and phase balancing easier to accomplish.

Amplitude and phase balance are achieved by tapping the output terminals 48 and 48'. For a 180 degree phase difference, the tap positions must be located at identical and opposite positions along the split-ring resonator 46.

Figure 3:
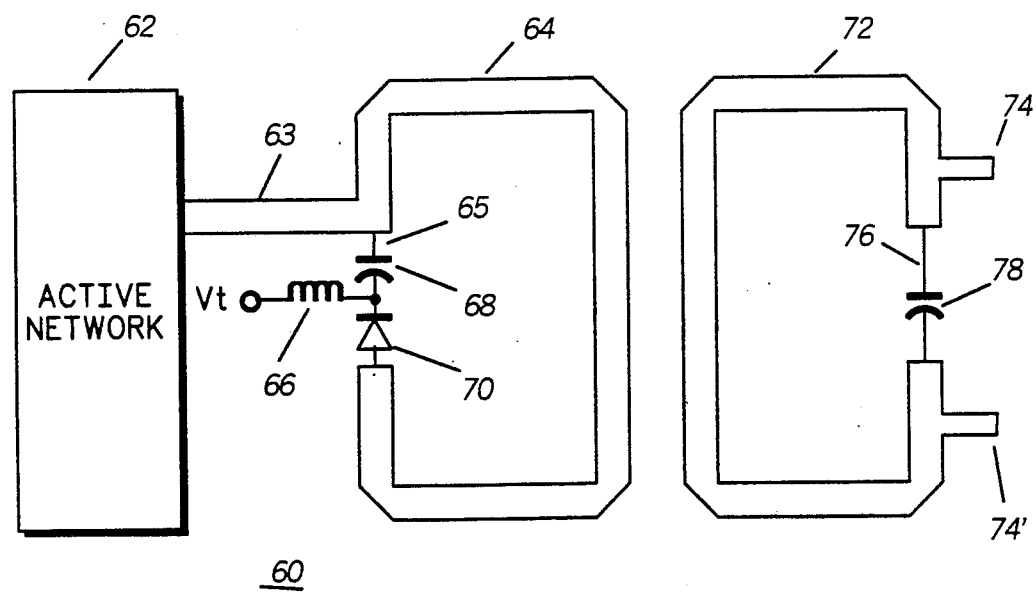
FIG. 3 is a amplitude and phase balanced voltage-controlled oscillator in accordance with the invention.*

Referring to FIG. 3, illustrated is a balanced oscillator 60 in which the main resonator is also a split-ring resonator 64. The frequency of oscillator 60 is voltage-controlled. The oscillator 60 also comprises an active network 62. The split-ring resonator 64 has a varactor circuit, comprising a capacitor 68 and a varactor diode 70, connected across a gap 65. An inductor 66 is connected to the capacitor 68 and to the cathode of the varactor diode 70 to couple a control voltage (Vt) to the varactor for controlling the oscillation frequency of the oscillator 60. The oscillator 60 also comprises a split-ring resonator 72 which is used for matching purposes. The split-ring resonator 72 comprises a gap 76, a capacitor 78, connected across the gap 76, and a pair of output terminals 74 and 74'. The split-ring resonator 72 operates in the same manner as the split-ring resonator 46 of FIG. 2. For broad-band operation the oscillator of FIG. 3 may be further modified to include a tuning network (such as the one connected across the gap 65) across the gap 76, in lieu of the capacitor 78).

Figure 4:
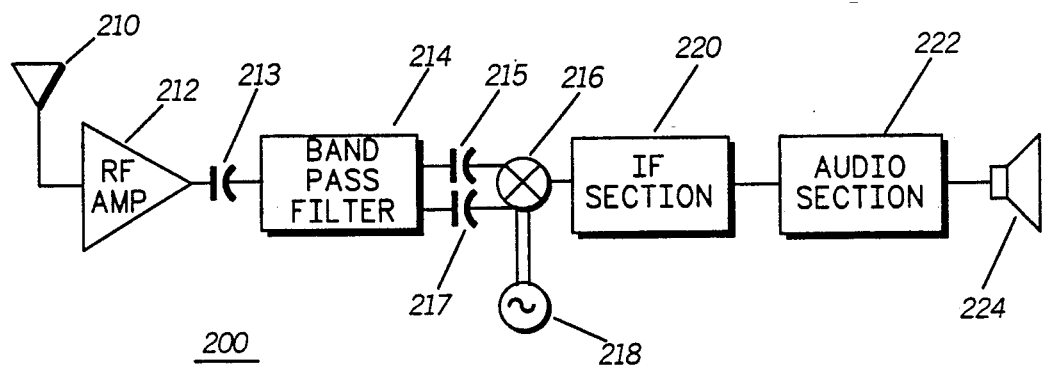
FIG. 4 shows a block diagram of a radio in accordance with the invention.

Referring to FIG. 4, a radio 200 is shown incorporating an oscillator 218 in accordance with the invention. A radio-frequency signal is received at a conventional antenna 210 and amplified by the RF amplifier 212 (an initial bandpass filter coupled from the antenna 210 to the amplifier 212 would also be advantageous). A BPF 214 is coupled from the amplifier 212 to the mixer 216 (through a capacitor 213). The oscillator 218 has a balanced output port coupled to a balanced input port of the mixer 216. The BPF 218 also has a balanced output port coupled to another balanced input port of the mixer 216 (through capacitors 215 and 217). The signal is then mixed with a reference signal provided by the oscillator 218 to produce an intermediate frequency (IF) signal. The IF signal is then applied to a conventional IF section 220 where it is processed and demodulated to produce an audio signal. The audio signal is then applied to a conventional audio section 222 and presented to a listener by a conventional speaker 224. The invention can also be used advantageously in a radio transmitter.

What is claimed is:
1. An oscillator comprising:
    a resonator for providing an oscillation frequency for the oscillator;
    an active network, coupled to the resonator, for driving the resonator;
    a first split-ring resonator, having at least a first edge and a second edge, the first edge being coupled to the resonator, and the second edge having a gap therein, and a first terminal located at one side of the gap in the second edge of the first split-ring resonator, and a second terminal symmetrically located at the other side of the gap in the second edge of the first split-ring resonator.

2. The oscillator of claim 1, further comprising a capacitor connected across the gap in the first split-ring resonator.

3. The oscillator of claim 2, wherein the resonator comprises a second split-ring resonator having at least a first edge and a second edge, the first edge having a gap therein and being coupled to the active network, and the second edge being coupled to the first edge of the first split-ring resonator.

4. The oscillator of claim 3, wherein the second split-ring resonator comprises:
 a varactor connected across the gap in the first edge of the second split-ring resonator, the varactor being coupled to a control voltage for setting the oscillation frequency for the oscillator.

5. The oscillator of claim 4 wherein the varactor comprises a capacitor, and a varactor diode having its cathode connected to the capacitor.

6. A radio transceiver comprising:
 transmitter means, for transmitting radio-frequency signals;
 receiver means for receiving radio-frequency signals;
 a oscillator comprising:
 a resonator for providing an oscillation frequency for the oscillator;
 an active network, coupled to the resonator, for driving the resonator;
 a first split-ring resonator, having at least a first edge and a second edge, the first edge being coupled to the resonator, and the second edge having a gap therein, and a first terminal located at one side of the gap in the second edge of the first split-ring resonator, and a second terminal symmetrically located at the other side of the gap in the second edge of the first split-ring resonator.

7. The radio transceiver of claim 6, wherein the oscillator further comprises a capacitor connected across the gap in the split-ring resonator.

8. The radio transceiver of claim 7, wherein the oscillator further comprises a second split-ring resonator having at least a first edge and a second edge, the first edge having a gap therein and being coupled to the active network, and the second edge being coupled to the first edge of the first split-ring resonator.

9. The radio transceiver of claim 8, wherein the oscillator further comprises:
 a varactor connected across the gap in the first edge of the second split-ring resonator, the varactor being coupled to a control voltage for setting the oscillation frequency for the oscillator.

10. The radio transceiver of claim 9, wherein the oscillator further comprises a capacitor, and a varactor diode having its cathode connected to the capacitor.

11. An oscillator comprising:
 resonator means for providing an oscillation frequency for the oscillator;
 active driver means, coupled to the resonator means, for driving the resonator means;
 a first split-ring resonator, having at least a first edge and a second edge, the first edge being coupled to the resonator, and the second edge having a gap therein, and a first terminal located at one side of the gap in the second edge of the first split-ring resonator, and a second terminal symmetrically located at the other side of the gap in the second edge of the first split-ring resonator.

12. The oscillator of claim 11, further comprising a capacitor connected across the gap in the first split-ring resonator.

13. The oscillator of claim 12, wherein the resonator comprises a second split-ring resonator having at least a first edge and a second edge, the first edge having a gap therein and being coupled to the active network, and the second edge being coupled to the first edge of the first split-ring resonator.

14. The oscillator of claim 13, wherein the second split-ring resonator comprises:
 a varactor connected across the gap in the first edge of the second split-ring resonator, the varactor being coupled to a control voltage for setting the oscillation frequency for the oscillator.

15. The oscillator of claim 14 wherein the varactor comprises a capacitor, and a varactor diode having its cathode connected to the capacitor.

* * * * *